Dec. 19, 1961 J. E. BEGGS 3,013,328

METHOD OF FORMING A CONDUCTIVE FILM

Filed Oct. 22, 1954

Inventor:
James E Beggs,
by Paul A. Frank
His Attorney.

United States Patent Office 3,013,328

Patented Dec. 19, 1961

3,013,328

METHOD OF FORMING A CONDUCTIVE FILM

James E. Beggs, Schenectady, N.Y., assignor to General Electric Company, a corporation of New York Filed Oct. 22, 1954, Ser. No. 464,080
14 Claims. (Cl. 29—155.7)

This invention relates to conducting films and the formation of conducting films. While this invention is subject to a large number of modifications, it is particularly suited to the formation of conducting films which are utilized in printed circuits and resistance heating elements and will be particularly described in this connection.

Among the previously known methods of forming conducting films are those of the type which involve the process of applying a carbon or other conducting film to an insulating base member and subsequently applying metal thereto by means of an electroplating process. For example, a printed circuit can be constructed by outlining the desired circuit with a conductive material, such as graphite and electroplating those portions of the circuit outlined by the graphite to thereby result in a conducting film defining a circuit. Printed circuits formed in this manner must be subsequently processed in order to form mechanical and electrical connections to the circuit.

Other methods of forming conducting films on a base member include the use of certain metal hydrides in combination with a solder metal which are painted on the surface and subsequently fired; however, control over the conductivity of the resulting film is sometimes difficult to obtain.

It is, therefore, an important object of this invention to provide a conducting film and methods of formation of conducting films.

Another object of this invention is to provide conducting films and methods of making conducting films which have uniform resistance characteristics during prolonged periods of high temperature operation.

It is also an object of this invention to provide conducting films having predetermined thermal coefficients of resistance and methods of forming these films.

Another object of this invention is to provide an improved heater and method of fabrication thereof. Still another object of this invention is to provide an improved printed circuit and method of fabrication of printed circuits.

According to an aspect of this invention, a conducting film is formed on a base member by applying a coating of a compound to the portions of the base member which are to be coated with the film, applying in contact with the compound at least one metal and heating the base member and the applied metal to form a conducting film. According to other aspects of this invention, the resistance characteristics of the conducting film are controlled by utilization of predetermined base member materials and applied metals in connection with specific heat processing.

Figure 1:
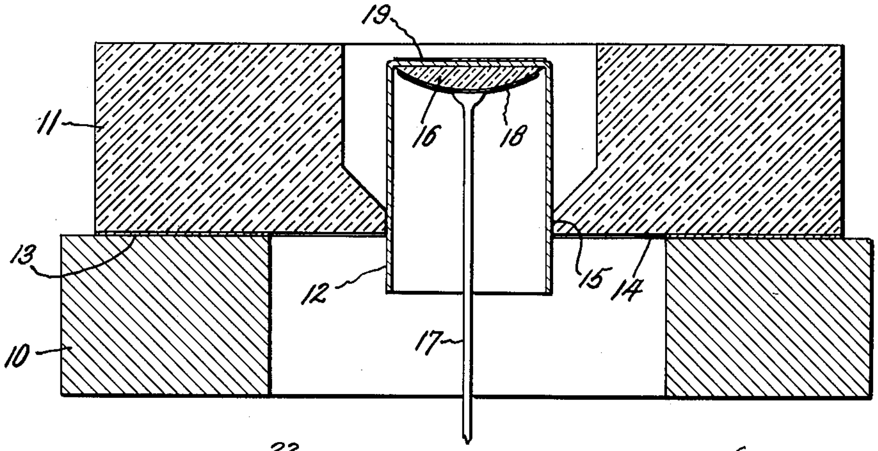
Figure 2:
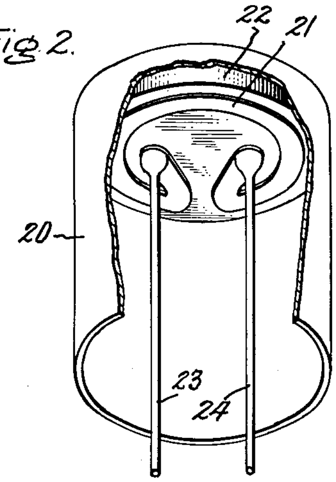
Figure 5:
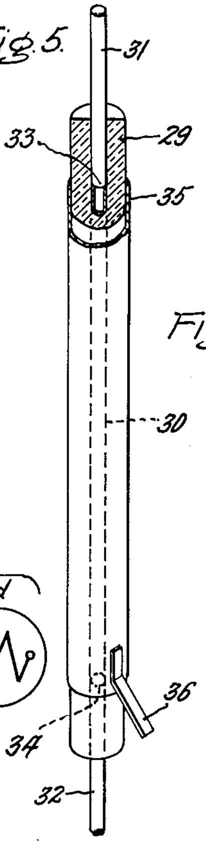
Figure 6:
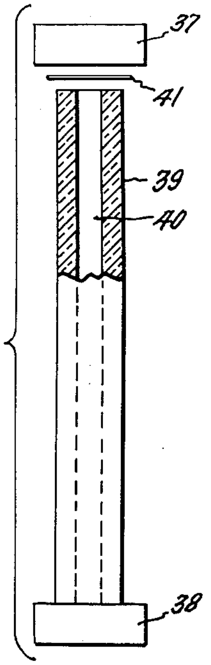
Figure 3:
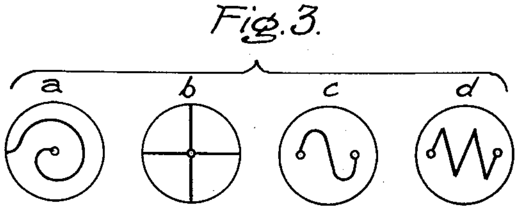
Figure 4:
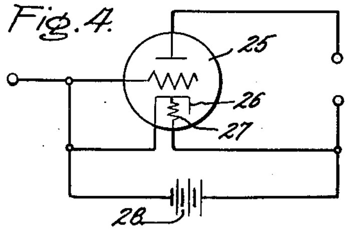

Other important aspects and objects of this invention will become more apparent from the following specification and claims when taken in connection with the figures of the drawing in which FIG. 1 illustrates a cathode and cathode heater assembly formed in accordance with this invention; FIGS. 2 and 3 illustrate modifications of cathodes formed in accordance with this invention; FIG. 4 illustrates a schematic circuit used to explain the application of a high resistance heater formed in accordance with this invention and FIGS. 5 and 6 illustrate resistance heaters which can be formed in a single heating operation.

An improved method is provided for forming a conducting film at the same time and during the process of forming other connections and mechanical bonds. For example, FIG. 1 illustrates a portion of an electric discharge device which utilizes a process in accordance with this invention. There is illustrated a cathode connector 10, a member 11 of insulating material which retains cathode 12. This portion of the electric discharge device is formed by placing a shim 13 of metal, such as, for example, nickel, on top of the cathode connector 10 which may be made, for example, of titanium metal and placing on top thereof insulating member 11 which, for example, may consist of a high purity alumina ceramic. The cathode 12 which, for example, consists of a thin cup of titanium or nickel, in this example nickel, is inserted in alumina member 11 and nitrocellulose binder is coated on the lower surface 14 of member 11 and along surface 15. Ceramic button or wafer 16 is glued into the top of the cup and heater lead 17 is glued in place in the center of the cup by means of nitrocellulose binder which includes metal hydride, such as titanium hydride. If the cup is formed from titanium metal, the button can be bonded to the cup by holding the button in contact with the cup and heating to a temperature of the order of 1250° C. for a short period. At this temperature, the titanium and ceramic react to form a firm bond.

A layer of nitrocellulose binder 18 is applied over the lower surface of ceramic button 16. A conventional triple carbonate coating 19 is applied to the upper surface of the cathode cup and this entire assembly is incorporated in a complete electric discharge device, such as those described in my copending U.S. patent applications Serial Nos. 464,126, now Patent No. 2,868,610 and 464,079, now Patent No. 2,981,897, filed herewith and assigned to the same assignee as this application.

When the assembly illustrated in FIG. 1 is heated to the eutectic melting temperature of nickel-titanium alloy, i.e., in the order of 955° C., the nickel shim and a portion of the titanium cathode connector 10 alloy and form a liquid which flows along the nitrocellulose binder which has been carbonized by the high temperature heating to make connection with the cathode 12 and to bond the cathode 12 to member 11 along surface 15. At the same time, the titanium hydride on the end of heater lead 17 is decomposed and alloys with the heater lead, which may be of any suitable material, such as iron or nickel, and forms a liquid which flows over the coating 18 to form a heater connection with the outer shell of the cathode 12 and with heater lead 17. It is readily apparent that this process provides a method of bonding metal and ceramic members of an electric discharge device and simultaneously forming a low resistance conducting film without an excess of solder metal being present.

It will also be apparent that the above-described process is subject to a very large number of variations and modifications. The basic process herein disclosed consists essentially of coating a base member, in this case the ceramic cathode retainer 11, with a material which contains carbon and applying in contact therewith at least two metals which form an alloy which readily flows over the carbon coating to form a conducting film.

The use of titanium and nickel has been given by way of example only, since the cathode connector member 10 can be formed of any of the metals, such as titanium, zirconium, hafnium, thorium, tantalum or alloys thereof and the shim metal may, for example, consist of any of the metals, such as iron, nickel, cobalt, copper, chromium, molybdenum, platinum or alloys thereof and the shim metal and the cathode connector metal can be readily interchanged. For example, a heater for operation at temperatures of the order of 1000° C. can be formed by using iron shims on a titanium base, since the eutectic melting point of titanium-iron alloy is of the order of 1080° C. The base for the film may consist of any material that withstands temperatures in the order of the melting point of eutectic alloys of these metals without undue softening or sublimation, ceramics of the general classes of aluminas, beryllias, seatites and forsterites being preferred.

The thickness of the nitrocellulose coating effectively controls the resistance of the metallic film. That is, a thick nitrocellulose coating forms a thick layer of carbon over which a relatively thick low resistance film of metal is formed while a thin layer of nitrocellulose results in a thin relatively high resistance film of metal. In the specific example illustrated in FIG. 1, the film formed along surface 14 has a relatively low resistance and the film 18 has a relatively high resistance, if it is desired to form a high voltage heater, or, if desired, a relatively low resistance in the case of a low voltage heater.

As an alternative and as another example of the simultaneous formation of a resistive film and bonding process, heater lead 17 can be brazed to the ceramic button 16 prior to application of the nitrocellulose coating so that upon heating no solder metal flows along the nitrocellulose coating 18 thereby resulting in a relatively high resistance carbon film.

Conducting films consisting either of carbon materials or of a metal alloy in combination with a sufficiently heavy carbon base have a negative thermal coefficient of resistance which is due to the presence of carbon which inherently has a negative temperature coefficient. In addition, relatively long heating and processing time results in reaction of the titanium-nickel alloy with the ceramic to form titanium-ceramic combinations which also have negative thermal coefficients of resistance. It is often desirable to produce a conducting film which has a zero or positive thermal coefficient of resistance and this is easily achieved by applying a metallic film and controlling the heating and composition of the metallic film so that relatively little reaction takes place with the base member; i.e., the thermal coefficient of resistance is determined by the amount of a compound of the base and applied additives, such as carbon and metal, that appear in the film.

For example, a resistor can be formed on a ceramic base consisting of high purity alumina, i.e., approximately 95% pure $Al_2O_3$ plus 5% fluxes, on which a slurry of approximately 70% titanium hydride ($TiH_2$) and approximately 30% nickel powder is painted in the form of a line or pattern in the order of a fraction of a mil in thickness. The base and slurry are rapidly heated to the approximate melting temperature of a eutectic alloy of the titanium and nickel powder while an ohm meter is connected to the ends of the coating.

An extremely high resistance is initially observed which gradually reduces as the titanium and nickel combine. When the desired resistance is reached, the unit is immediately removed from the heater and allowed to cool.

The basic process of this reaction is that as the slurry is heated, a positive thermal coefficient of resistance is observed, since titanium and nickel inherently have a positive coefficient of resistance; however, as the eutectic temperature is reached and the titanium-nickel alloy starts to react with the alumina, the thermal coefficient of resistance starts to swing from a positive coefficient through zero to a negative coefficient as increasing portions of the alumina base react with the slurry thereby providing a ready method for obtaining a conducting coating having a positive, zero or negative coefficient of resistance. In the above example, the necessary heating time is in the order of 1 minute and resistors having resistances in the order of 5000 ohms or less are easily formed in this manner. The ability to control the thermal coefficient of resistance of the resulting metallic film is determined only by the composition of the materials involved and the availability of techniques for controlling the heating of the materials so as to obtain the desired degree of reaction between the coating metals and the base.

The above-described coating of titanium and nickel is given merely by way of example and it is considered to be within the scope of this invention to form resistive films in accordance with this process utilizing any other combination of materials which satisfactorily react with the base to obtain a controlled temperature coefficient of resistance. For example, hydrides of other metals, such as, for example, zirconium, hafnium or thorium or tantalum, may be substituted for the titanium hydride and powders of other metals, such as, for example, iron, cobalt, nickel, molybdenum, copper and platinum, can be substituted for the nickel powder. Alloys or combinations of these metals can also be used alone or in combination with nickel, iron, or, if films for high temperature operation are desired, molybdenum being preferred. Alternatively, a mixture of powdered metals can be used or a shim of one of the metals may be placed in contact with a powdered layer of metal. Base members may be formed of various materials, such as ceramics, from the general classes of aluminas, forsterites, beryllias and steatites.

FIGS. 2 and 3 illustrate modified forms of cathodes having separate heaters which are formed in accordance with this invention. FIG. 2 illustrates a cathode shell 20 having a resistance heater 21 formed on ceramic button or wafer 22 and connected by heater leads 23 and 24. FIGS. 3*a* through 3*d* inclusive illustrate modifications of the heater pattern illustrated in FIG. 2. For example, the patterns illustrated in FIGS. 3*a* and 3*b* are particularly suited for heaters wherein the cathode is part of the heater circuit and the patterns illustrated in FIGS. 3*c* and 3*d* are particularly suited for the utilization in separately heated cathode constructions. Each of these heater patterns are formed on an insulator, such as, for example, a high purity alumina ceramic button.

It is noted that this button can be coated over the entire area with a carbon-containing compound, such as nitrocellulose, or coated in the form of patterns, such as those illustrated in FIGS. 3*a* through 3*d* inclusive. In a high temperature heater, i.e., temperatures of the order of 800° C. or higher, these coatings are usually of the type that leave a carbon film only. When a low temperature heater is desired, the coating can be formed in accordance with the previously described methods so as to result in a carbon coating having metallic additives or substantially all metal so as to result in a film having a positive zero or negative thermal coefficient of resistance. These and other cathodes utilizing conducting film heaters are more completely described and are claimed in my copending application Serial No. 464,078, now Patent No. 2,875,367 filed concurrently herewith and assigned to the same assignee as this invention.

FIG. 4 illustrates a circuit utilizing a heater formed in accordance with the methods of this invention wherein the same power supply provides both plate current and heater current. For example, the heater illustrated in FIG. 1 is suitable for utilization in a miniature electric discharge device cathode which can be heated with approximately 0.2 watt at 100 volts and, therefore, requires only 2 milliamperes of current. This small current drain can be supplied from the filtered direct current supply used to supply the plate voltage so that no hum problem is encountered.

It is apparent that the circuit of FIG. 4 can be modified to accommodate a separately heated cathode; however, in this particular embodiment, it is shown as being adapted for utilization with a heater which utilizes the cathode as one of the heater leads and wherein 25 illustrates a triode electric discharge device having heater and cathode assembly 26 with high resistance heater element 27 which is connected in circuit with a power supply 28 which provides both heater and plate power.

FIG. 5 illustrates how the method and techniques of this invention can be applied to make resistive film heaters for operation in a vacuum. A tube 29 having bore 30, and formed of one or more insulating materials, such as alumina, is coated along the bore 30 with nitrocellulose binder. Connecting wires 31 and 32 of, for example, tantalum, are inserted in each end and coated at regions 33 and 34 or at the outer ends of the tube with metal hydride, such as, for example, titanium hydride. The entire assembly is heated to a temperature in the order of 1200° C. so that the titanium hydride decomposes and reacts with the material of tube 29 to effectively braze wires 31 and 32 to the tube 30 and make connection to the nitrocellulose binder which is carbonized by the heating.

When suitable power supply is connected to the terminals of the unit, it can be heated in a vacuum to temperatures in the order of 1200° to 1400° C. without severe oxidation or deterioration of the bonds. A heater formed in this manner can be placed inside of a conventional radio tube cathode or it can be metallized with a coating 35, on which an emissive layer may be formed so as to result in an integral heater-cathode unit. A cathode connecting tab 36 is provided to make electrical connection to the metallized coating.

FIG. 6 illustrates a modification of the heater unit illustrated in FIG. 5 wherein caps 37 and 38 are brazed on to the ends of ceramic tube 39 having a bore 40. This construction results in the inside of the ceramic tube being sealed in vacuum as the conducting film is formed. The bore is coated with a mixture of approximately 30% iron and 70% titanium hydride in a nitrocellulose binder and titanium end caps 37 and 38 are placed on the ends of the tube with nickel shims 41 disposed between the caps and the tube. The entire assembly is vacuum heated to a temperature in the order of 1000° C. to form an alloy of the shim and cap metal and bond the cap members to the ceramic tube. As the temperature is raised to a temperature in the order of 1100° C., the iron and titanium start to alloy and react with the ceramic tube. When a resistor of the proper characteristics is obtained, the heat is turned off and the heater unit allowed to cool. In this manner, the vacuum seal is formed before the conducting film is formed and precise control of the resistance characteristics is obtained. A heater of this type can be operated safely in air at temperatures up to 900° C. which permits extremely high dissipative rating and, since the film on bore 40 is in a vacuum-tight enclosure, it is not affected by moisture or oxidation so that the resistance of the element is substantially constant throughout the life thereof.

It is readily apparent that the films described in connection with the illustrations of FIGS. 5 and 6 can likewise be formed of other materials and in accordance with other processes such as those previously described in connection with this disclosure, since the materials and processes described in connection with the formation of these resistive elements are given merely by way of example.

It is readily apparent that the methods and practices herein disclosed in connection with the description of this invention are readily adapted to and ideally suited to forming the various components of a printed circuit. The metallizing process to form the conducting coatings can be carried out in such a way that the resulting resistors and conducting coatings have a substantially zero thermal coefficient of resistance. A printed circuit formed in this fashion is idealy suited for applications wherein equipment is subject to very wide variations in ambient temperature and/or where the equipment is subject to very severe heating.

For example, resistive, capacitive and inductive elements can be printed on a base by means of a conventional roller technique whereby the desired circuit and circuit components are rolled on in the form of a nitrocellulose pattern. Appropriate metal or metals or mixtures thereof can then be applied to a portion of or all of those portions to which a metallized coating is to be applied and the thickness of the coating and/or nitrocellulose outline and processing determines the end resistance characteristics of the circuit.

Entire printed circuit assemblies can be fired so as to result in a complete circuit being formed in a single heating operation. Such a printed circuit is ideally suited for rapid fabrication, miniaturization and the formation into disposable electronic circuit units.

While this invention has been described in connection with a limited number of specific examples, it will be readily apparent that it is subject to a large number of variations and modifications and it is intended, in the appended claims, to cover all such variations and modifications as come within the true spirit and scope of this invention.

What I claim as new and desire to secure by Letters Patent of the United States is:

1. The method of forming a resistance film on the surface of a ceramic member which comprises forming a coating by applying a carbon containing compound to the surface of said member on which the film is to be formed, said carbon-containing compound being of the type that when decomposed by heat leaves a carbon residue upon ceramic material, placing a metal hydride in contact with said coating, the metal being selected from the group consisting of titanium, zirconium, hafnium, thorium, and tantalum, heating the member, the compound and hydride in a vacuum to form a carbonaceous film on said member, decompose the hydride and combine the metal of the hydride with the ceramic and controlling the duration and level of said heating to control the resistance characteristic of the film produced.

2. The method of forming a resistance film on the surface of a ceramic member which comprises forming a coating by applying a carbon containing compound to the surface of said member on which the film is to be formed, said carbon-containing compound being of a type that when decomposed by heat leaves a carbon residue upon ceramic material, placing a metal hydride in contact with said coating, the metal being selected from the group consisting of titanium, zirconium, hafnium, thorium, and tantalum, placing a metal selected from the group consisting of nickel, iron, platinum, chromium, copper and molybdenum in contact with said metal hydride, heating the member, the compound, the metal and the hydride in a vacuum to form a carbonaceous film on said member, decompose the hydride, alloy the metals and combine the alloy with the ceramic and controlling the duration and level of said heating to control the resistance characteristic of the film produced.

3. The method of forming a resistance film on the surface of a ceramic member which comprises forming a coating by applying a carbon containing compound to the surface of said member on which the film is to be formed, said carbon-containing compound being of a type that when decomposed by heat leaves a carbon residue upon ceramic material, placing titanium and nickel in contact with one another and on said coating, heating the member, the compound, and the titanium and nickel in a vacuum to form a carbonaceous film on said member and to alloy the metals and combine the alloy with the ceramic and controlling the duration and level of said heating to control the resistance characteristic of the film produced.

4. The method of forming a resistance film coating on the inner surface of a ceramic insulating supporting member having a cavity and at least one entrance to the cavity, applying a carbon-containing compound on the surface of the cavity, the compound being of the type that when decomposed by heat leaves a carbon residue on an insulating member, placing a conducting material across each entrance to the cavity and in contact with portions of the member surrounding the entrance for closing the same, the conducting material being of a type that when heated sufficiently forms a bond with insulating material, and simultaneously heating the member, compound and conducting material in an atmosphere inert to the final resulting resistance film coating to decompose the compound and thereby form a carbonaceous film on the cavity surface and to seal the entrance with a gas-tight enclosure.

5. The method of forming a resistor from a tube-shaped, ceramic insulating member applying a carbon-containing compound to the inner surface of the tube-shaped member, the compound being of the type that when decomposed by heat leaves a carbon residue on insulating material, closing off the interior of the tube-shaped member with conducting material of a type that bonds to insulating material when heated sufficiently, and simultaneously heating the member, compound and conducting material in a vacuum to decompose the compound and thereby form a carbonaceous film on the interior surface of the tube-shaped member and seal the interior with a vacuum-tight enclosure.

6. The method of forming a resistor from a cylindrically-shaped, ceramic insulating member having two open ends comprising applying a carbon-containing compound to the inner surface of the cylindrical-shaped insulating member, the carbon-containing compound being of a type that when decomposed by heat leaves a carbon residue on insulating material, closing the interior of the cylindrically-shaped member by placing conducting material across the ends thereof, the conducting material being of the type that bonds to insulating material when heated sufficiently, and heating the member, compound and conducting material in an atmosphere inert to the resulting resistor to decompose the compound and thereby form a carbonaceous film on the cylindrically-shaped member and seal the interior with a gas-tight enclosure at the ends thereof.

7. The method of forming a resistor from a cylindrically-shaped ceramic member having open ends comprising applying a nitrocellulose compound over the interior surface of the member and extending to the open ends thereof, placing a first metal selected from the group consisting of titanium, zirconium, hafnium, thorium and tantalum and a second metal selected from the group consisting of nickel, iron, platinum, chromium, copper and molybdenum in contact with each other across the open ends of the cylindrical ceramic for closing the interior of the member and simultaneously heating the cylindrically-shaped ceramic, the compound and the first and second metals in vacuum to form a carbonaceous film on the interior of said cylindrical ceramic member, alloy the metals and bond the alloy with the ceramic and thereby vacuum seal the interior of said member with the carbonaceous film conductively connected to the end closures provided by said metals.

8. The method of forming a resistor from a cylindrically-shaped insulating member having two open ends comprising coating a carbon-containing compound over the inner surface of the member, the carbon-containing compound being of the type that when decomposed by heat leaves a carbon residue on an insulating member, closing the ends of the member with a first metal in contact with a second metal wherein the first metal is selected from the group consisting of titanium, zirconium, hafnium, thorium and tantalum and where the second metal is selected from the group consisting of nickel, iron, platinum, chromium, copper and molybdenum, and simultaneously heating the member, the compound and the first and second metals in a vacuum to decompose the compound and thereby form a carbonaceous film on the interior of the member and to seal the interior with a vacuum-tight closure.

9. The method of forming a resistor from an insulating member enclosure having open ends and a ceramic interior surface, comprising applying to the interior surface a coating of material that upon heating produces a resistance film, placing two metals in contact with each other across the open ends of said enclosure to close off the interior thereof, the metals selected to form a bond with the insulating member at a temperature lower than the melting temperature of one of said metals, and simultaneously heating the coating, the insulating member and the two metals in a substantially inert atmosphere to form a resistance film on the interior surface and to thereby gas-tight seal the interior of the insulating member.

10. The method of forming a resistor having a resistance film from a ceramic insulating member enclosure having open ends and an interior surface, comprising applying to the interior surface a coating of material that upon heating produces a resistance film, placing two metals in contact with each other across the open ends of said enclosure to close off the interior thereof, the metals selected to form an alloy at a lower temperature than the melting temperature of either metal and which alloy forms a bond with the insulating member, and simultaneously heating the coating, the insulating member and the two metals in an atmosphere substantially inert to the resistance film resulting from heating said coating and to alloy the metals and to bond the alloy with the insulating member and to thereby gas-tight seal the interior of the insulating member, and to form a resistance film on the interior surface conductively connected to the end closures provided by said metals.

11. The method of forming a resistor having a resistance film from a ceramic enclosure having two open ends and an interior surface, comprising applying to the interior surface of the ceramic enclosure a coating of material that upon heating produces a resistance film, placing across both open ends of the ceramic enclosure two metals in contact with each other wherein one of the two metals is selected from the group consisting of titanium, zirconium, hafnium, thorium, and tantalum, and the other of the two metals is selected from the group consisting of nickel, iron, platinum, chromium, copper, cobalt, and molybdenum for closing off the interior of the enclosure, and simultaneously heating the coating, the ceramic enclosure and the two metals in an atmosphere substantially inert to the resulting resistance film to alloy the metals and to bond the alloy with the ceramic enclosure and to thereby gas-tight seal the interior of the ceramic enclosure, and to form a resistance film on the interior surface of the ceramic enclosure electrically connected to the end closures provided by said metals.

12. The method of forming a resistor from a ceramic enclosure having two open ends and an interior surface, comprising applying to the interior surface of the ceramic enclosure a coating comprising a metal selected from the group consisting of titanium, zirconium, hafnium, thorium, and tantalum, placing across both ends of the ceramic enclosure conducting material that upon sufficient heating forms a gas seal bond with the ceramic enclosure for closing off the interior of said enclosure, and heating the ceramic enclosure and applied coating and the conducting material in an atmosphere substantially inert to the resistance film resulting from heating of the applied coating and to bond the conducting material with the ceramic enclosure and to thereby gas-tight seal the interior of the ceramic enclosure and electrically connect the resistance film and the end closures provided by said metals.

13. The method of forming a resistor from a ceramic enclosure having two open ends and an interior surface, comprising applying to the interior surface of the ceramic enclosure a coating comprising a metal selected from the group consisting of titanium, zirconium, hafnium, thorium, and tantalum, placing across both ends of the ceramic enclosure two metals in contact with each other wherein one of the two metals is selected from the group consisting of titanium, zirconium, hafnium, thorium, and tantalum, and the other of the two metals is selected from the group consisting of nickel, iron, platinum, chromium, copper, cobalt, and molybdenum for closing off the interior of said enclosure, and simultaneously heating the ceramic enclosure and the two metals in an atmosphere substantially inert to the resistance film resulting from heating of the coating and to alloy the metals and to bond the alloy with the ceramic enclosure to thereby gas-tight seal the interior of the ceramic enclosure and conductively connect the resistance film with the end closures provided by said metals.

14. The method of forming a resistor from a ceramic enclosure having two open ends and an interior surface, comprising applying to the interior surface a coating comprising a carbon containing material that when decomposed by heat leaves a carbon residue upon ceramic material, and a metal selected from the group consisting of titanium, zirconium, hafnium, thorium, and tantalum, placing across both open ends of the ceramic enclosure two metals in contact with each other wherein one of the two metals is selected from the group consisting of titanium, zirconium, hafnium, thorium, and tantalum, and the other of the two metals is selected from the group consisting of nickel, iron, platinum, chromium, copper, cobalt, and molybdenum for closing off the interior of said enclosure, and simultaneously heating the coating, the ceramic enclosure, and the two metals in an atmosphere substantially inert to the resulting resistance film to alloy the metals across the open ends of the ceramic enclosure and to bond the alloy with the ceramic enclosure and to thereby gas-tight seal the interior of the ceramic enclosure, and to form a resistance film on the interior of the ceramic enclosure electrically connected to the end closures provided by said metals.

References Cited in the file of this patent

UNITED STATES PATENTS

| | | |
|---|---|---|
| 1,847,653 | Jones et al. | Mar. 1, 1932 |
| 2,109,879 | De Boer | Mar. 1, 1938 |
| 2,280,135 | Ward | Apr. 21, 1942 |
| 2,341,219 | Jones | Feb. 8, 1944 |
| 2,384,493 | Rolle | Sept. 11, 1945 |
| 2,440,691 | Jira | May 4, 1948 |
| 2,512,455 | Alexander | June 20, 1950 |
| 2,564,706 | Mochel | Aug. 21, 1951 |
| 2,570,248 | Kelley | Oct. 9, 1951 |
| 2,629,166 | Marsten | Feb. 24, 1953 |
| 2,647,218 | Sorg et al. | July 28, 1953 |
| 2,803,054 | Kohring | Aug. 20, 1957 |